(12) United States Patent
Wadley et al.

(10) Patent No.: US 6,478,931 B1
(45) Date of Patent: Nov. 12, 2002

(54) APPARATUS AND METHOD FOR INTRA-LAYER MODULATION OF THE MATERIAL DEPOSITION AND ASSIST BEAM AND THE MULTILAYER STRUCTURE PRODUCED THEREFROM

(75) Inventors: Hadyn N. G. Wadley, Keswick; Xiaowang Zhou; Junjie Quan, both of Charlottesville, all of VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 12 days.

(21) Appl. No.: 09/634,457

(22) Filed: Aug. 7, 2000

Related U.S. Application Data

(60) Provisional application No. 60/147,733, filed on Aug. 6, 1999, and provisional application No. 60/203,439, filed on May 10, 2000.

(51) Int. Cl.[7] .......................... C23C 14/34; C23C 16/00; B05D 5/06; B05D 1/36
(52) U.S. Cl. ............................. 204/192.12; 204/192.11; 204/192.15; 204/192.2; 204/298.04; 204/298.06; 204/298.08; 118/723 R; 118/723 MP; 427/162; 427/255.7; 427/402
(58) Field of Search ..................... 204/192.11, 192.12, 204/192.15, 192.2, 298.04, 298.06, 298.08; 118/723 R, 723 MP; 427/162, 255.7, 402

(56) References Cited

U.S. PATENT DOCUMENTS

| | | | | |
|---|---|---|---|---|
| 4,093,349 A | * | 6/1978 | Mills | 350/288 |
| 4,923,585 A | | 5/1990 | Krauss et al. | 204/298.04 |
| 5,492,605 A | * | 2/1996 | Pinarbasi | 204/192.11 |
| 5,569,544 A | | 10/1996 | Daughton | 428/611 |
| 5,595,830 A | | 1/1997 | Daughton | 428/611 |
| 5,617,071 A | | 4/1997 | Daughton | 338/32 R |
| 5,618,575 A | | 4/1997 | Peter | 427/8 |
| 5,661,449 A | * | 8/1997 | Araki et al. | 338/32 R |
| 5,795,663 A | | 8/1998 | Koike et al. | 428/692 |
| 5,858,455 A | | 1/1999 | Chambliss et al. | 427/131 |
| 5,871,622 A | | 2/1999 | Pinarbasi | 204/192.11 |
| 5,923,504 A | | 7/1999 | Araki et al. | 360/113 |
| 5,951,767 A | | 9/1999 | Colombo | 118/688 |
| 5,976,263 A | | 11/1999 | Poole | 118/726 |
| 5,982,101 A | | 11/1999 | Fremgen, Jr. et al. | 315/111.91 |
| 6,015,632 A | | 1/2000 | Chambliss et al. | 428/682 |
| 6,051,113 A | | 4/2000 | Moslehi | 204/192.12 |
| 6,052,262 A | | 4/2000 | Kamiguchi et al. | 360/113 |
| 6,059,872 A | | 5/2000 | Ngan et al. | 106/226.8 |
| 6,063,244 A | | 5/2000 | Pinarbasi | 204/192.11 |
| 6,086,727 A | | 7/2000 | Pinarbasi | 204/192.11 |

OTHER PUBLICATIONS

S. Desa et al., Reactor–scale Models for rf diode sputtering of metal thin films, J. Vac. Sci. Technology A 17(4), 1926–1933, Jul./Aug. 1999.

(List continued on next page.)

*Primary Examiner*—Steven H. Ver Steeg
(74) *Attorney, Agent, or Firm*—Robert J. Decker

(57) ABSTRACT

A method of producing a multilayer structure that has reduced interfacial roughness and interlayer mixing by using a physical-vapor deposition apparatus. In general the method includes forming a bottom layer having a first material wherein a first plurality of monolayers of the first material is deposited on an underlayer using a low incident adatom energy. Next, a second plurality of monolayers of the first material is deposited on top of the first plurality of monolayers of the first material using a high incident adatom energy. Thereafter, the method further includes forming a second layer having a second material wherein a first plurality of monolayers of the second material is deposited on the second plurality of monolayers of the first material using a low incident adatom energy. Next, a second plurality of monolayers of the second material is deposited on the first plurality of monolayers of the second material using a high incident adatom energy.

34 Claims, 7 Drawing Sheets

OTHER PUBLICATIONS

X. W. Zhou et al., The Low Energy Ion Assisted Control of Interfacial Structure: Ion Incident Energy Effects, Journal of Applied Physics vol. 87 No. 12, pp. 8487–8496, Jun. 15, 2000.

X. W. Zhou et al., Atomistic Simulations of Low Energy Ion Assisted Vapor Deposition of Metal Multilayers, Journal of Applied Physics vol. 87 No. 5, pp. 2273–2281, Mar. 1, 2000.

X. W. Zhou et al., Atomistic Simulations of the Vapor Deposition of Ni/Cu/Ni Multilayers: The Effects of Adatom Incident Engergy, J. of Applied Physics vol. 84 No. 4, pp. 2301–2315, Aug. 15, 1998.

X. W. Zhou et al., Atomistic Simulation of the Vapor Deposition of Ni/Cu/Ni Multilayers: Incident Adatom Angle Effects, Journal of Applied Physics vol. 87 No. 1, pp. 553–563, Jan. 1, 2000.

H.N.G. Wadley et al., Artificially Layered Nanocomposites Fabricated By Jet Vapor Deposition Composites Engineering, vol. 5, No. 7, pp. 935–950, (1995).

AVS, The Electron: Celebrating 100 Years, 44th National Symposium, October 20–24, 1997. Cover, pp. 187–188, back cover.

L.M. Hsiung et al., Jet Vapor Deposited Aluminum–Aluminum Oxide Nanolaminates, Novel Techniques in Synthesis and Processing of Advanced Materials, The Minerals, Metals & Materials Society (1995).

Y.G. Yang et al., A monte Carlo Simulation of the Physical Vapor Deposition of Nickel, Acta Mater, vol. 45, No. 4, pp. 1455–1468, (1997).

X.W. Zhou et al., Vacany Formation During Vapor Deposition, Acta Mater. vol. 45, No. 11, pp. 4441–4452, (1997).

X. W. Xhou et al., Twin Formation During the Atomic Deposition of Copper, Acta Mater., vol. 47, No. 3, pp. 1063–1078, (1999).

H.N.G. Wadley et al., Multiscale Simulation of the RF Diode Sputtering of Copper, Mat Res. Soc. Symp. Proc. vol. 538, pp. 323–328 (1999).

Robert A. Johnson, Potentials for the Atomistic Oxidation, VIPO: Modelling, Model Reduction, and Model–Based Control for Plasma Assisted Thin Flm Processes, VIPO Program Review Meeting, Feb. 8, 2000.

X. W. Zhou et al., Monte Carlo Simulations of Vapor Deposition, VIPO: Modelling, Model Reduction, and Model–Based Control for Plasma Assisted Thin Film Processes, VIPO Program Review Meeting, Haydn N.G. Wadley, Accomplishments, VIPO: Modelling, Model Reduction, and Model–Based Control for Plasma Assisted Thin Film Processes, VIPO Program Review Meeting, Feb. 8, 2000.

Matthew Neurock et al., DFT Studies of ALuminum Oxidation, VIPO: Modelling, Model Reduction, and Model––Based Control for Plasma Assisted Thin Film Processes, VIPO Program Review Meeting, Feb. 8, 2000.

* cited by examiner

APPARATUS AND METHOD FOR INTRA-LAYER MODULATION OF THE MATERIAL DEPOSITION AND ASSIST BEAM AND THE MULTILAYER STRUCTURE PRODUCED THEREFROM

CROSS-REFERENCES TO RELATED APPLICATIONS

The present invention claims priority from U.S. Provisional Application Serial No. 60/147,733 filed Aug. 6, 1999, entitled "Method and Apparatus for Giant Magnetoresistive Multilayer Vapor Deposition," and Provisional Application No. 60/203,439 filed May 10, 2000 entitled "Low Energy and Modulation Low Energy Assisted Growth of Multilayered Structures" the entire disclosures of which are hereby incorporated by reference herein.

U.S. GOVERNMENT RIGHTS

This invention was made with United States Government support under Grant No. NAGW1692, awarded by NASA and Grant No. NAG-1-1964, awarded by DARPA/NASA. The United States Government has certain rights in the invention.

FIELD OF THE INVENTION

The present invention is directed to the fabrication of multilayer structures, and more particularly an improved physical-vapor deposition apparatus and method of use (and structure produced therefrom) for intra-layer modulated material deposition and assist beam.

BACKGROUND OF THE INVENTION

It is well known in the prior art to utilize RF or DC magnetron sputter deposition systems for fabrication of thin film devices such as magnetic recording sensors and storage media. Such sputter deposition systems, commonly referred to as "plasma sputtering deposition," are characterized by crossed electric and magnetic fields in an evacuated chamber into which an inert, ionizable gas, such as argon, is introduced. The gas is ionized by electrons accelerated by the electric field, which forms a plasma in proximity to a target structure. The crossed electric and magnetic fields confine the electrons in a zone between the target and substrate structures. The gas ions strike the target structure, causing ejection of atoms that are incident on a workpiece, typically a substrate on which it is desired to deposit one or more layers of selected target materials.

In the prior art conventional plasma sputtering deposition systems, relatively low operating pressures are utilized. This results in high translational energy atom and ion fluxes incident upon the substrate. This flux introduces manufacturing process difficulties, as device thicknesses become increasingly smaller. In particular, high levels of interfacial roughness and/or mixing are observed.

It is known in the prior art to utilize ion beam sputter deposition in certain applications to overcome some of the difficulties encountered with conventional RF/DC sputter techniques. Several aspects of ion beam sputter deposition, commonly referred to as "ion beam deposition" (IBD), differ from conventional plasma sputter processes and provide significant advantages. For example, (1) the use of a lower background pressure results in less scattering of sputtered particles during the transit from the target to the substrate; (2) control of the ion beam directionality provides a variable angle of incidence of the beam at the target; (3) a nearly monoenergetic beam having a narrow energy distribution provides control of the sputter yield and deposition process as a function of ion energy and enables accurate beam focusing and scanning; (4) the ion beam is independent of target and substrate processes which allows changes in target and substrate materials and geometry while maintaining constant beam characteristics and allowing independent control of the beam energy and current density; (5) a second inert gas ion beam can be directed at the substrate to provide ion assisted deposition.

However, while the conventional IBD process has achieved much success, this conventional process also suffers from unacceptable high levels of interfacial roughness and interlayer mixing.

Also known in the prior art is to utilize molecular beam epitaxy (MBE) process to achieve physical-vapor deposition apparatus, as illustrated in U.S. Pat. No. 5,976,263 to Poole and U.S. Pat. No. 5,951,767 to Columbo the contents of which are incorporated herein by reference. In MBE, metal atoms are thermally evaporated and condensed onto a substrate. The atoms have low translational energies (~kT, where k is Boltzmann's constant and T is the absolute temperature) of <0.1 eV. During deposition, atomic assembly needed to form a high quality interface structure occurs by thermally activated diffusion on the grow surface. In conventional MBE, this thermally activated diffusion causes the grown films to suffer rough and interdiffused interfaces.

Several important applications, including giant magneto-resistive (GMR) exchange biased spin-valves thin-film read heads, photonic components, and semiconductor heterostructures, use multi-layer material stacks to perform various electronic, photonic signal processing and data storage functions. For instance, anti-reflection coating (ARC) films and dielectric optical filters utilize alternating layers of dielectric oxides with controlled thickness and roughness. Another application that uses multilayer material structures is the magnetic data storage industry. For instance, giant magneto-resistive (GMR) thin-film read head and magnetic random access memory (MRAM) concepts use multilayered material structures comprising stacks of non-magnetic conductive, ferromagnetic, and/or insulating material layers as thin as 10 to 30 Å (Angstrom).

In 1987, the giant magneto-resistive or GMR effect was discovered. GMR materials, usually consisting of at least two magnetic nanostructure entities separated by a nonmagnetic spacer. They display a large change of resistance upon the application of a magnetic field. GMR materials have a larger relative resistance change and have increased field sensitivity as compared against traditional anisotropic magneto-resistive or MR materials, such as Ni80Fe20 films. The improved relative resistance change and field sensitivity of GMR materials and related magnetic sensing elements allow the production of sensors having greater sensitivity and signal-to-noise ratio than conventional sensors. Thus, for instance, data storage systems using GMR read sensors can read data in smaller bit areas as compared to conventional read head devices. However, material stacks for fabricating GMR sensors generally use 6 to 8 layers of 4 to 6 different materials, as compared to the MR material stacks, which usually have only 3 layers of materials such as permalloy layers with Soft Adjacent Layers (SAL). Thus, creating material stacks for GMR read sensors generally requires more processing steps, including more complicated equipment and fabrication techniques for high-yield manufacturing of high-performance GMR thin-film heads.

In order to meet its goals for improved storage density, industry has turned to exchange biased spin-valve GMR thin-film read heads. Spin-valve GMR read heads are comprised of multi-layer depositions of 10 to 100 angstrom thick material films having precise thickness and microstructure control as well as extremely cohesive interface control at each interface of a multi-layer spin-valve GMR stack. Each spin-valve GMR stack must have good crystalinity in conjunction with abrupt and smooth material interfaces with minimal interface mixing to ensure proper GMR response and to establish excellent thermal stability. Essentially, GMR stacks may require controlled deposition of metallic multilayers which comprise ultrathin films as thin as about 5 to 10 atomic monolayers.

Another application for GMR materials is magnetic random access memories ("MRAM"), which are monolithic silicon-based nonvolatile memory devices presently based on a hysteretic effect in magneto-resistive or MR materials. MRAM devices are beginning to be used in aerospace and military applications due to their excellent nonvolatile memory bit retention and radiation hardness behavior. However, the MRAM devices can be easily integrated with silicon integrated circuits for embedded memory in a host of future applications in cell phones, personal computers, microprocessors, personal digital assistants (PDAs), etc. The implementation of GMR materials, such as spin-dependent tunnel junctions, could improve the electrical performance of MRAM devices to make MRAM devices competitive with semiconductor DRAM and flash EPROM memory devices. However, the performance of MRAM memory depends on precise control of layer thickness values and the microstructures of various thin films in a GMR stack of thin metallic films. Thickness fluctuations and other interface or microstructural variations in thin metallic layers can cause variation in MRAM device performance.

Similar difficulties can occur with periodic laminated multi-layer structures, such as laminated flux guide structures of iron, tantalum and silicon di-oxide.

As such, GMR materials have significant technological importance because they can be used to develop highly sensitive magnetic field sensors, read heads for disk drives, and MRAM that promise nonvolatility, radiation hardness, low power consumption, densities comparable to dynamic random access memory and access speeds comparable to static random access memory. All these applications require a high GMR ratio (defined as the maximum resistance change divided by the resistance at magnetic saturation), a low saturation magnetic field, a near-zero coercivity, a weak temperature dependence, and a high thermal stability. Many groups are now seeking to develop a vapor phase synthesis process that results in multilayers with this optimum combination of properties.

GMR properties are sensitive to nanoscale structural features of the films, their defect populations and the intrinsic properties of the material system. For instance, the lowest resistance appears to result from a sandwich structure with chemically separated planar interfaces. The GMR ratio therefore depends on nanoscale features of the multilayers such as the wavelength and amplitude of the interfacial roughness and the width and extent of interfacial chemical mixing. It may also be affected by grain texture, composition, layer purity, and the various types of lattice defects (including vacancies, voids, dis-locations, and twins) trapped in the films.

U.S. Pat. No. 5,661,449 to Araki et al. discloses forming a multilayer film of a plurality of magnetic and non-magentic layers alternatively stacked. The '449 patent discloses forming the plurality of layers (104, 105, 106) with a deposition energy of 0.01 to 10.0 eV. However, the approach of the '449 patent is unsatisfactory because it fails to account for the modulation required within each individual layer at the atomic monolayer application so as to provide for reduced interfacial roughness and layer intermixing as in the present invention.

FIGS. 1A and 1B illustrate the result of a conventional physical-vapor deposition process whereby the deposition energy is held constant during the deposition of each individual layer (104, 105, 106). A multilayer structure 100 having been deposited on a nickel substrate 101, having a growth direction in the y-coordinate direction. The orientation of the multilayer structure 100 and substrate 101 is defined by letting the x, y, and z coordinates correspond to the reference numbers 112, 111, and 110, respectively. The multilayer structure 100 is created by assigning atomic positions to an assembly of 960 atoms based on a fcc lattice with an equilibrium nickel lattice constant, a=3.5196 Å. The substrate crystal consisted of 120 (224) planes in the x direction, 3 (111) planes in the y direction, and 16 (220) planes in the z direction. To prevent the crystal from shifting during adatom impact and minimize the effect of the bottom surface, the bottom two (111) planes were fixed. The multilayer structure 100 was deposited by alternatively depositing about 20 Å (approximately 10 monolayers) of copper (Cu) followed by about 20 Å (approximately 10 monolayers) of nickel (Ni).

Referring to FIG. 1A, copper and nickel atoms are marked by light and dark spheres, respectively. It can be seen that at the low incident energies (about 0.1 eV or less) and a fixed (normal) incident angle, θ=0 degrees, typical of either thermal evaporation (e.g., MBE) or high pressure (e.g., diode) sputtering, the interfaces 102 and 103 exhibit both significant interfacial roughness and copper layer intermixing in the subsequently deposited nickel layer.

Referring to FIG. 1B, when the multilayer structure 100 was deposited with an incident energy at 5.0 eV the interfacial roughness of both the copper on nickel interface 103 and the nickel on copper interface 102 were significantly reduced. However, the multilayer structure 100 suffers from excessive layer intermixing as the copper atoms are dispersed in the subsequently deposited nickel layer.

Turning to FIGS. 2A and 2B, other types of defects, including vacancies, twins, and dislocations are prevalent in conventional approaches. Typical examples of twin and dislocation structures are depicted in FIGS. 2A and 2B, respectively.

There is therefore a need in the art for an effective physical-vapor deposition process and system that produces a multilayer structure having reduced interfacial roughness and layer intermixing since these are critically important for spin-dependent electron transport.

The present invention has numerous applications including, but not limited thereto, for the growth of metal multilayers (e.g., magneto-electronic devices for sensing magnetic fields, magnetic random access memory, spin transistors and the like), semiconductor heterostructures including magnetic semiconductors, ceramic multilayers, optical filters or mirrors, x-ray mirrors, laser mirrors (with dielectric and metal multilayers), laser diodes, fiber optic waveguides and combinations of these material systems.

The present invention systems, devices, and structures will have a broad application including computers, peripheral computer components, cameras, telephones, televisions, miscellaneous electronic and communication components, and personal digital assistants (PDAs).

SUMMARY OF THE INVENTION

According to the present invention, a method of producing a multilayer structure by using a physical-vapor deposition apparatus is provided. In general the method comprises the steps of: forming a bottom layer having a first material wherein a first plurality of monolayers of the first material is deposited on an underlayer using a low incident adatom energy. Next, a second plurality of monolayers of the first material is deposited on top of the first plurality of monolayers of the first material using a high incident adatom energy. Thereafter, the method further includes forming a second layer having a second material wherein a first plurality of monolayers of the second material is deposited on the second plurality of monolayers of the first material using a low incident adatom energy. Next, a second plurality of monolayers of the second material is deposited on the first plurality of monolayers of the second material using a high incident adatom energy.

Accordingly, the incident energy can be ramped with the thickness of a given layer as the monolayers are accumulated/deposited. For example, the second monolayer has energy less than the third monolayer but more than the first monolayer, i.e., $E_{n-1} < E_n < E_{n+1}$.

Some of the advantages of the present invention are that it provides an apparatus and method for fabricating multilayer structures that has reduced interfacial roughness and interlayer mixing.

These and other objects, along with advantages and features of the invention disclosed herein, will be made more apparent from the description, drawings, and claims that follow.

BRIEF DESCRIPTION OF THE DRAWINGS

The foregoing and other objects, features and advantages of the present invention, as well as the invention itself, will be more fully understood from the following description of preferred embodiments, when read together with the accompanying drawings in which.

DETAILED DESCRIPTION OF THE INVENTION

A number of apparatuses and methods for physical-vapor deposition and resultant structures are known in the art. Some typical examples are disclosed in the following list of U.S. Patents, and are herein incorporated by reference:

| | |
|---|---|
| Krauss et al. - U.S. Pat. No. 4,923,585 | Pinarbasi - U.S. Pat. No. 5,492,605 |
| Daughton - U.S. Pat. No. 5,569,544 | Daughton - U.S. Pat. No. 5,595,830 |
| Peter - U.S. Pat. No. 5,618,575 | Araki et al. - U.S. Pat. No. 5,661,449 |
| Pinarbasi - U.S. Pat. No. 5,871,622 | Araki et al. - U.S. Pat. No. 5,923,504 |
| Fremgen, Jr. et al. - U.S. Pat. No. 5,982,101 | Daughton - U.S. Pat. No. 5,617,071 |
| Chambliss et al. - U.S. Pat. No. 5,858,455 | Colombo - U.S. Pat. No. 5,951,767 |
| Poole - U.S. Pat. No. 5,976,263 | Chambliss et al. - U.S. Pat. No. 6,015,632 |
| Koike et al. - U.S. Pat. No. 5,795,663 | Moslehi - U.S. Pat. No. 6,051,113 |
| Kamiguchi et al. - U.S. Pat. No. 6,052,262 | Pinarbasi - U.S. Pat. No. 6,063,244 |
| Ngan et al. - U.S. Pat. No. 6,059,872 | Pinarbasi - U.S. Pat. No. 6,086,727 |

Figure 3:
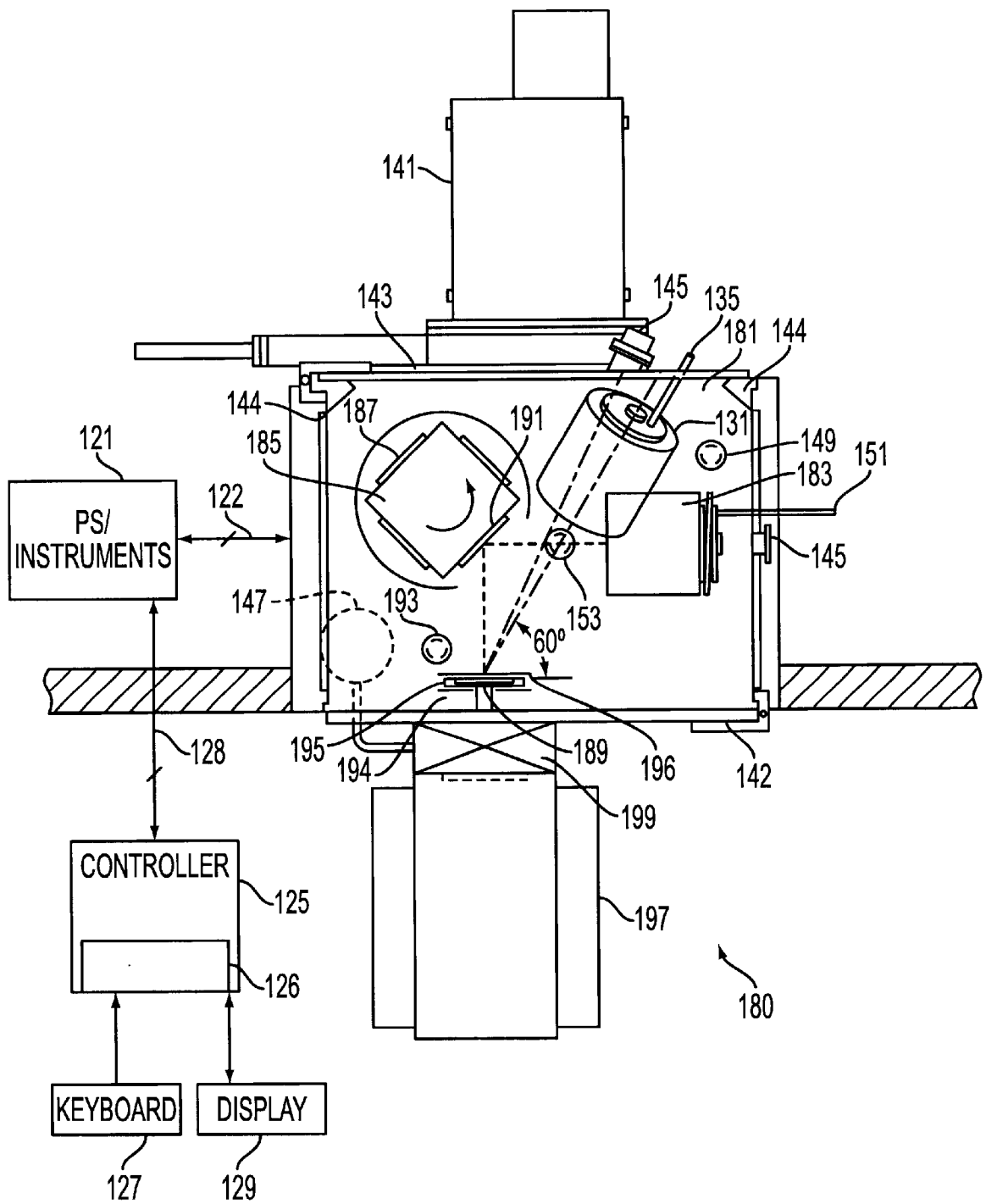
FIG. 3 is a block diagram illustrating a preferred embodiment of an ion beam deposition (IBD) system according to the principles of the present invention.

Referring to FIG. 3, a detailed diagram illustrating a preferred embodiment of an ion beam (sputtering) deposition (IBD) system 180 according to the principles of the present invention is shown, as similarly illustrated in U.S. Pat. No. 5,492,605 to Pinarbasi. The ion beam deposition (IBD) system 180 includes a vacuum chamber 181 in which a primary ion beam source 183 is mounted, a multi-target, rotatable support 185 having one or more targets 187 of selected materials mounted thereon and a deposition substrate, underlayer, or workpiece 189. The underlayer 189 may be considered a buffer layer made of material including, for example, Ta, Nb, Mo, Ti, W, Cr, or the like, and/or alloys thereof. An ion beam provided by the primary ion beam source 183 is directed at a selected target 191 where the impacting ions cause sputtering of the target material. The sputtered atoms emitted by the target material are directed onto the deposition substrate, underlayer, or other workpiece 189 on which is formed a layer of the selected target 191 material. A thickness monitor 193 is positioned closely adjacent the underlayer 189 to provide real-time, in-situ monitoring of the thickness of the growing film during deposition.

The underlayer, substrate or other workpiece 189 is mounted on a movable (or non-movable) pedestal or support member 195 which is retrieved into a cart mounted load-lockstage (loading port) 197 via a gate valve 199 for changing the workpiece 189. A turbo pump 147 is provided to pump down the load-lockstage 197. The pedestal 195 is temperature controlled, i.e., heated and cooled as required for the particular deposition process. The pedestal 195 may be rotatable by means of a linear/rotary motor drive (not shown) to allow selective deposition and other operations on a number of substrates 189 without reload between operations. The pedestal 195 includes a shutter 196 to prevent bombardment of the substrate 189 by sputtered materials during pre- and post-deposition operations such as, for example, precleaning of the target 191 with the primary ion source 183. Moveable shields 194 are provided to prevent material buildup on portions of the pedestal 195 and the gate valve 199 components.

More importantly, the shutter 196 or equivalent shutter means are incorporated so as to control the adatom incident energy during the intra layer deposition, i.e., at the atomic monolayer scale. Alternative emobodiments of modulating the adatom incident energy will discussed later.

During operation, the vacuum chamber 181 is maintained at an internal operation pressure on the order of $1 \times 10^{-4}$ Torr by a cart mounted vacuum pump system 141 via a port provided in the chamber adjacent rear door 143. Hinged front and rear doors 142 and 143, respectively, provide access to the chamber and components mounted therein for cleaning, replacement of targets and adjustment or repair. In addition, a number of observation ports 145 and accessory ports 149 are provided in the chamber walls. Internal electric heaters 144 mounted within the chamber provide a controlled environment within the chamber. Power and instrumentation for the system and its components are provided by a power supply/instrumentation module 121 coupled to the system via cables 122. The operation of the system is controlled by a programmable controller 125 or the like coupled to the system via cables 128.

The primary ion source comprises an ion gun, such as a Kaufman type ion source or the equivalent, adjustably mounted to provide a variable angle of incidence of the ion beam on the target 191 over a range of 0 degrees, i.e., normal to the target, to about 60 degrees. A number of gases including Ar, Kr and Xe gases are stored in pressurized bottles (not shown) and are selectably ported to the ion source 183 via inlet port 151 to provide a selectable sputtering gas as desired for matching to the selected target material. A probe 153 (a Faraday Cup is suitable for this purpose) is provided for analysis of the ion beam energy. A residual gas analyzer mounted on inside wall of the rear door 143 monitors and records partial pressures of the sputtering and background gases continuously, i.e., before, during and after the deposition process. The Kaufman source 181 provides an ion beam in the energy range of approximately 200 to 2000 eV. The ion source voltages, ion beam energy and current, selection of sputtering gas and other ion source parameters are automatically controlled by the programmable controller 125. The controller 125 includes a computer 126 coupled to operator input means such as a keyboard means 127 and display means 129 for entry of system operations parameters and instructions.

A secondary ion gun source 131, which may comprise a Kaufman type source or the equivalent, is mounted within the vacuum chamber 181 to provide substrate preclean etch and substrate ion-assisted deposition functions. The secondary source 131 is mounted to provide an ion beam of desired energy at an angle of incidence nominally at approximately 60 degrees. The angle of incidence is adjustable over a large range (0 to 90 degrees) to provide an optimum angle of incidence as required. The secondary ion source 131 is ported to a selected gas supply (not shown) via inlet port 135 to provide a desired ionizable gas for the ion source operation. The secondary ion source 131 is controlled by programmable controller 125 in a manner similar to that of the primary ion source 183.

Figure 4:
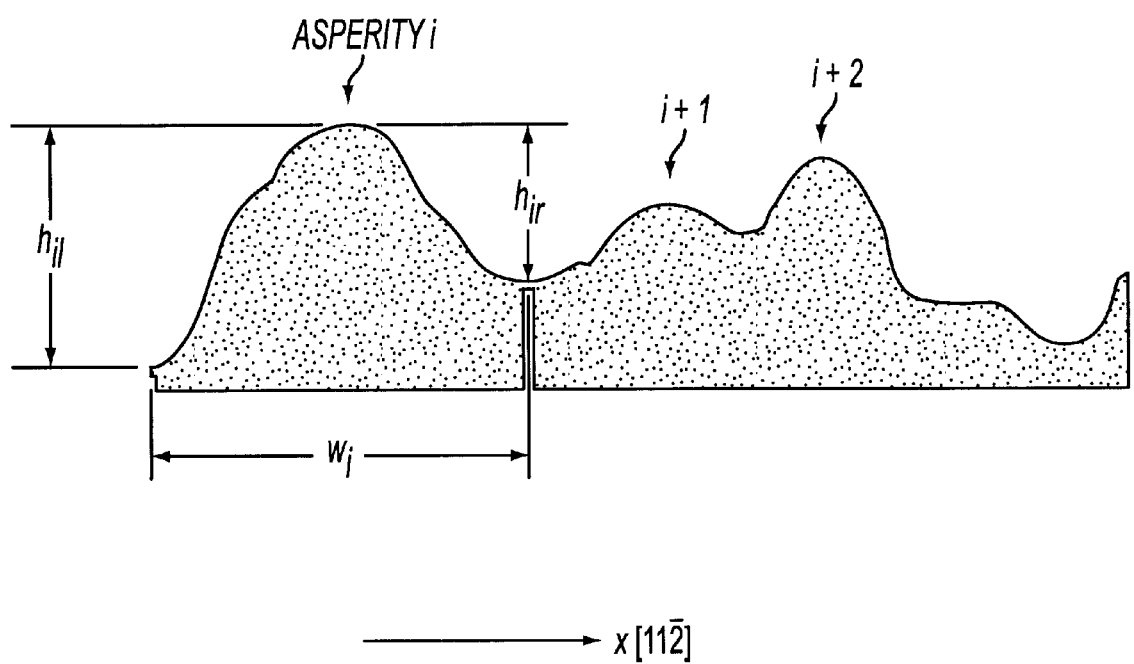
FIG. 4 is a graphical representation showing the parameters used to compute roughness($r_1$)

Referring to FIG. 4, to characterize the interfacial roughness of the multilayer structures there is shown an interfacial roughness parameter ("$r_1$"). Essentially, $r_1$ is defined in a manner that depends both on the height and the width of a surface asperity as follows:

$$r_1 = \sum_{i=1}^{n} \frac{h_{il} + h_{ir}}{2} \bigg/ \sum_{i=1}^{n} w_i$$

where $h_{il}$ and $h_{ir}$ are respectively the height measured from the left and right of the ith asperity, and $w_i$ is the width of this asperity. Summation is conducted over the n asperities in the x direction.

Figure 5:
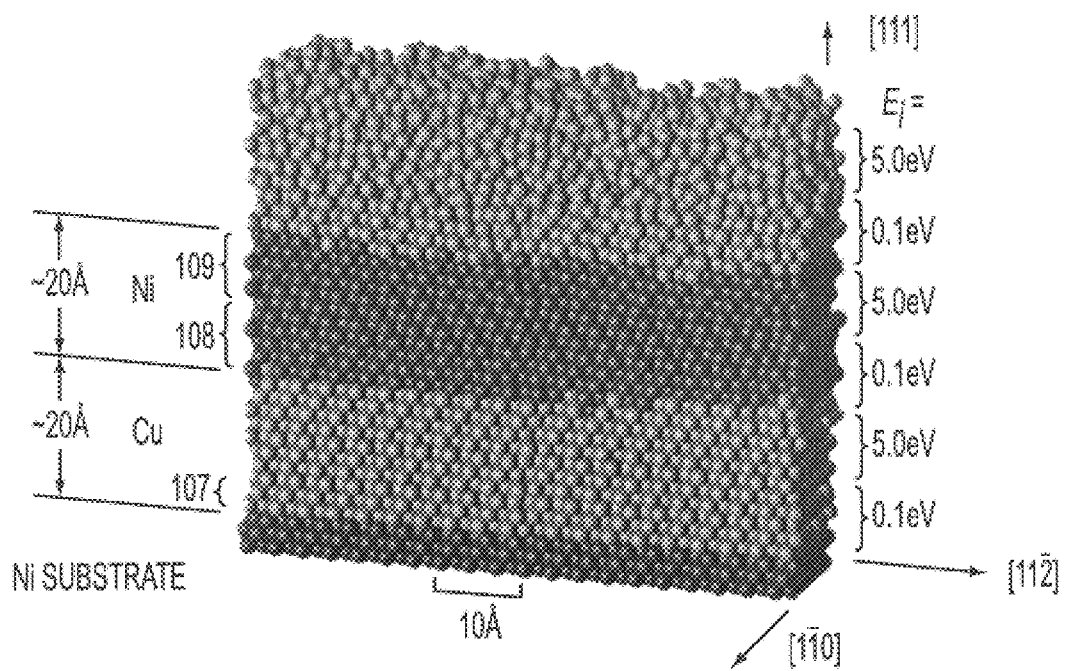
FIG. 5 is an atomic configurations of Ni/Cu/Ni multilayers deposited using intra-layer modulated incident energy according to the principles of the present invention.

Referring to FIG. 5, there is shown an illustrative mulitlayer structure formed by the present invention apparatus and method having reduced interfacial roughness and layer intermixing by modulating the incident adatom energy at the atomic monolayer level, i.e., intra-layer modulation by adjusting the incident energy within each layer. An exemplary monolayer is depicted by reference number 107. For example, the present invention apparatus deposits the first few (or predetermined plurality) monolayers 108 of a new metal with a low incident adatom energy level so as to avoid the exchange mechanism with the adjacent existing different layer material. Once, coverage by 4–5 monolayers has been achieved, the subsequent deposition of the energetic atoms needed to flatten the layer is much less likely to cause intermixing. A thickness sensor based on electron, ion, or electromagnetic scattering can monitor this. This low incident adatom energy (about 0.01 to 3.0 eV) avoids the intermixing by the exchange mechanism upon impact. Thereafter, the incident energy is then increased during the remaining (or predetermined plurality) monolayers 109 thereby providing a high incident adatom energy levels (about 3.0 eV to 15 eV) to promote the surface flatness without inducing intermixing between different metals of the different layers. It can be seen that interfacial roughness can then be reduced without causing the rise of intermixing.

It is also contemplated that the incident energy can be ramped with the thickness of a given layer as the monolayers are accumulated/deposited. For example, the second monolayer has energy less than the third monolayer but more than the first monolayer, i.e., $E_{n-1} < E_n < E_{n+1}$. Along these lines, various preselected monolayers and combinations thereof can be subjected to ramping and ramping variations.

Depending on the material and related factors, the low incident adatom energy will range from about 0.1 eV to about 5.0 eV and the high incident adatom energy will vary from about 1.0 eV to about 15.0 eV. The energy level is adapted to fluctuate within these ranges during the process of depositing each layer so as to provide a range of modulated energy within the given layer. Of course one skilled in the art would appreciate that these ranges could be expanded or restricted when required.

Figure 1A:
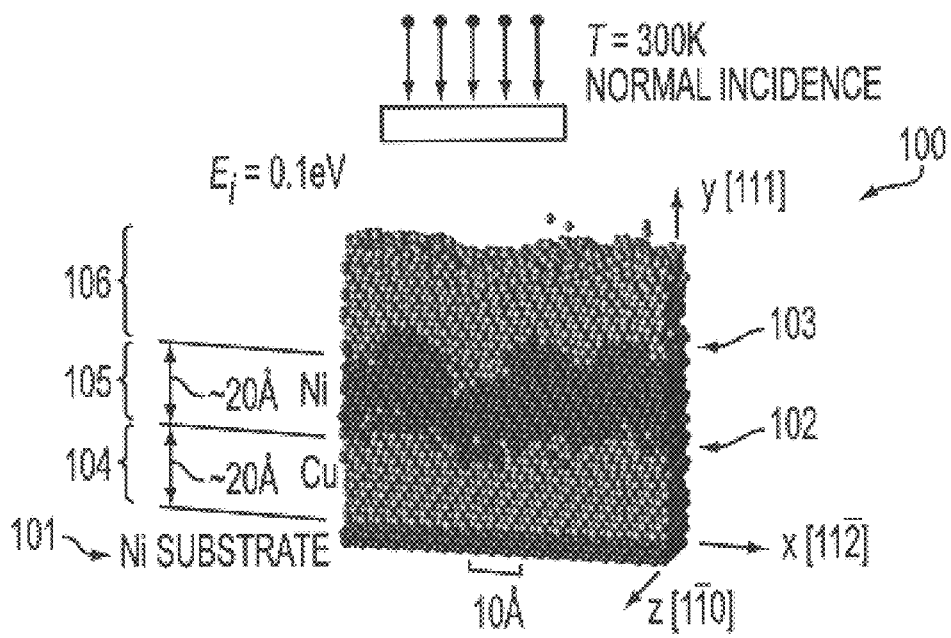
FIG. 1A is a schematic drawing of atomic configurations of conventional Ni/Cu/Ni multilayers deposited with single incident adatom energy of 0.1 eV throughout the entire layer.
Figure 1B:
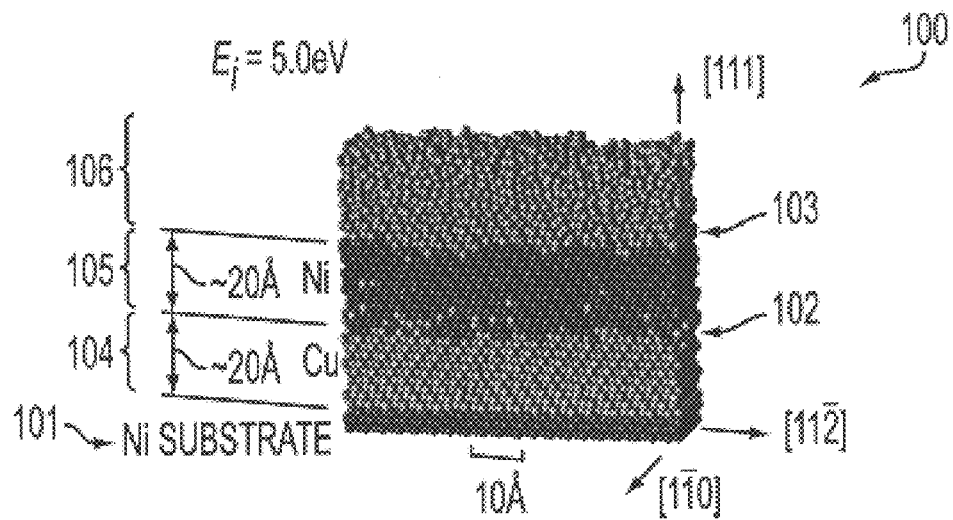
FIG. 1B is a schematic drawing of atomic configurations of conventional Ni/Cu/Ni multilayers deposited with single incident adatom energy of 5.0 eV throughout the entire layer.
Figure 2B:
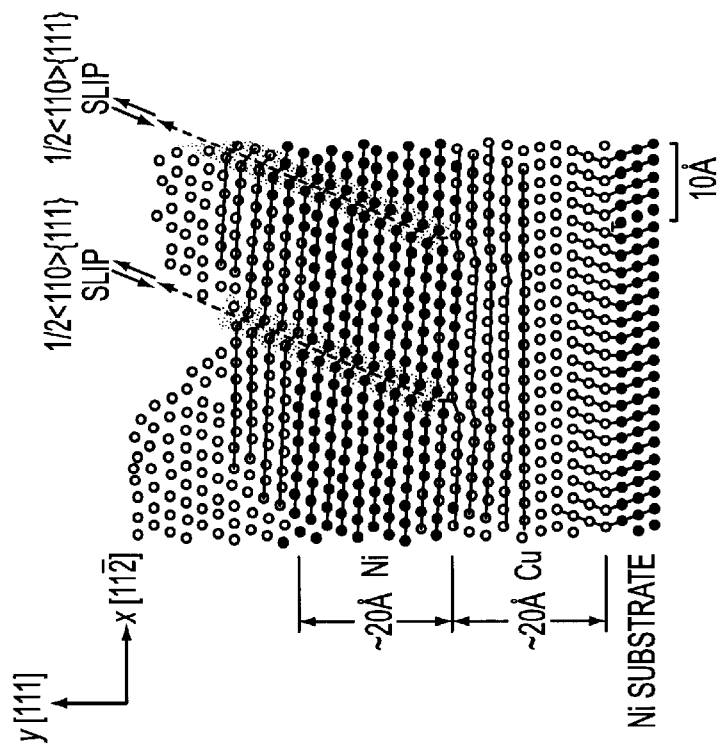
FIG. 2B is a schematic drawing of Ni/Cu/Ni multilayers in a pair of (220) planes showing dislocations.
Figure 2A:
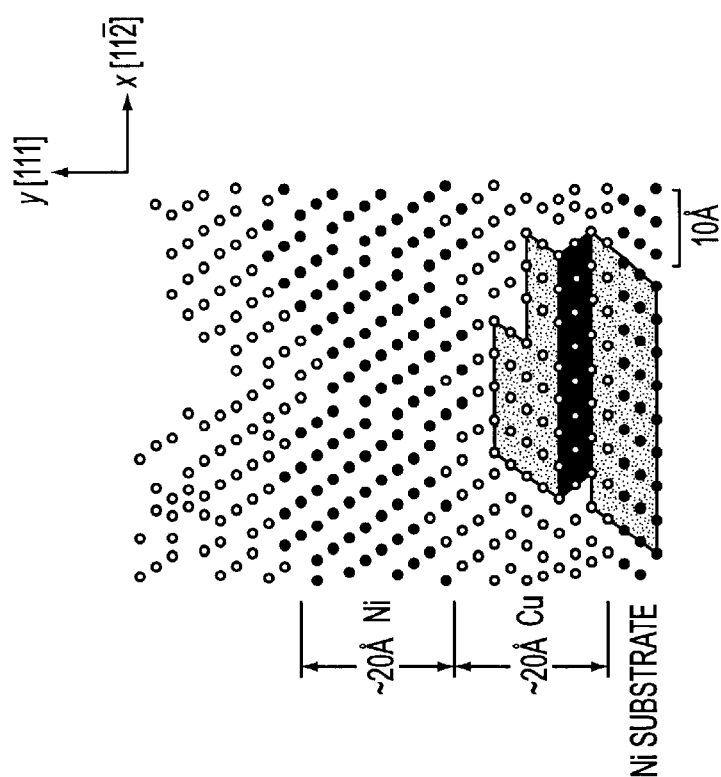
FIG. 2A is a schematic drawing of Ni/Cu/Ni multilayers in a single (220) plane showing twins defects.

Compared with the best outcome of the conventional single energy strategy, as seen in FIGS. 1A and 1B, the present invention intra-layer energy modulation strategy provides a significant improvement in both the interfacial roughness and the degree of intermixing.

Figure 6:
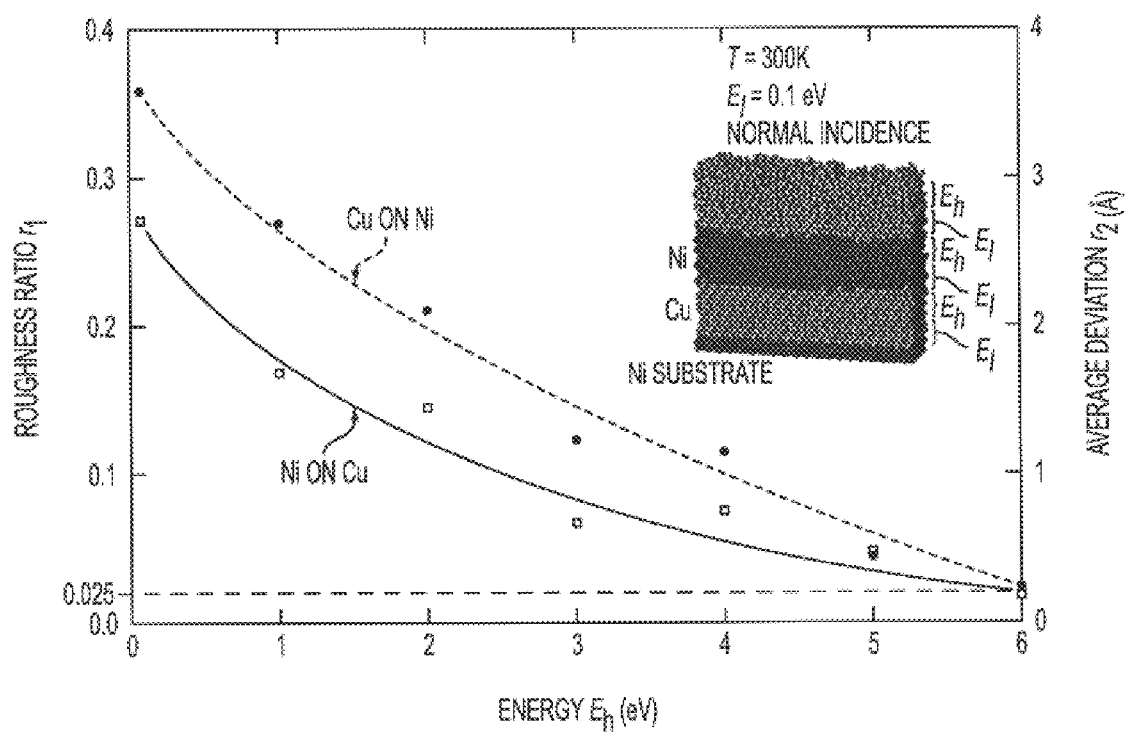
FIG. 6 is a graphical representation showing the interfacial roughness as a function of energy $E_h$ for intra-layer modulated energy deposition according to the principles of the present invention.
Figure 7:
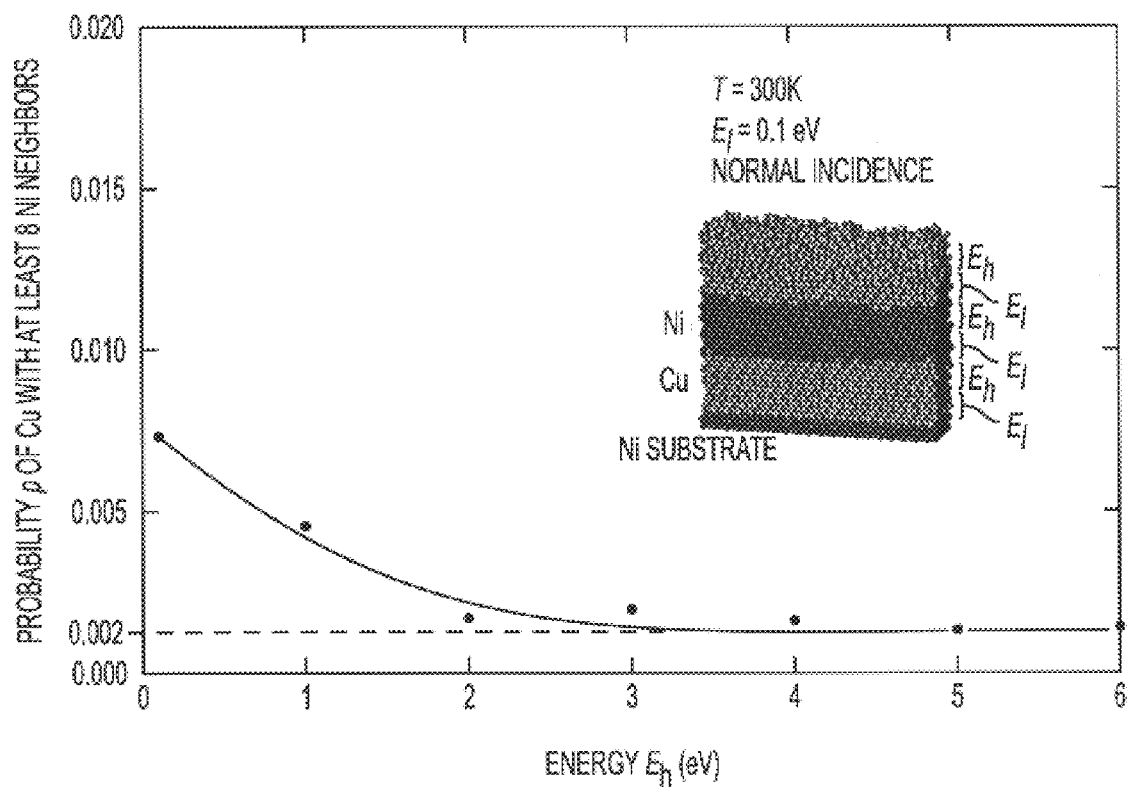
FIG. 7 is a graphical representation showing the interfacial mixing of copper in the nickel layer as a function of energy $E_h$ for intra-layer modulated energy deposition according to the principles of the present invention.

Referring to FIGS. 6 and 7, to illustrate the improved characteristics of a multistructure fabrication using the present invention method, the roughness of both interfaces and the degree of copper mixing in the nickel layer were calculated as a function of the high incident adatom energy "$E_h$", are illustrated graphically. Because the exchange mechanism is more difficult on flat surfaces, increasing $E_h$ not only improves the interfacial smoothness, but it also reduces the mixing. Referring to FIG. 6 it can be seen that the interfacial roughness ratio $r_I$ is about 0.025.

Alternatively, still referring to FIG. 6, using another measurement parameter, the multilayer structure is subject to only about 1 monolayer or less of interfacial mixing. For example, only one monolayer of copper is dispersed (migrated or mixed) with the Nickel layer, and/or vice versa.

Referring to FIG. 7, the graph indicates that by virtue of the present invention method the probability of "ρ" of Cu with at least 8 Ni neighbors is reduced to about 0.002.

Accordingly, the intra-layer modulated energy deposition method of the present invention that uses low incident energies to deposit the first few monolayers of each new metal layer and higher energies for the remainder monolayers results in superior interfacial roughness and interfacial mixing qualities compared to the prior art.

The present invention can be employed for various multilayer structures including, for example, synthesizing GMR multilayers. The present invention can be implemented by varying the incident kinetic energy of the sputter ions in an ion beam deposition process, controlling the acceleration voltage of the ion beam gun of the inert gas ions bombarding at the target, varying the target-substance distance, as well as varying the background pressure.

The variation or intra-layer modulation of the incident energy may be done manually or automatically by modifying known automated deposition equipment. For example, the shutter 196 may be used in conjunction with or substituted by other modulating means, systems, or devices. As one skilled in the art would appreciate other modulating means may include, but not limited thereto, the following (1) electrical, mechanical, manual, or pneumatically operated shutters (2) electrical chopping of the energy or particles (3) filament ignition of the plasma when the target is aligned or deposition is timely (4) DC or RF power source (or alternatively, a pulsed DC or pulsed RF source) applying either continuous wave or pulsed electrical energy (5) power distribution in pulses of varying length to provide time for atoms to diffuse over the deposition surface (6) gating ion beam, atoms, or particles (7) varying angle of incidence (8) electrostatic manipulation of the plasma, ions, or atoms (9) varying temperature (10) and/or equivalents thereof.

A second preferred alternative embodiment of the present invention is provided to improve the interfacial roughness and interlayer mixing by using a intra-layer modulating assist ion beam as previously discussed, but with an alternative design. In this second embodiment, the present invention deposition apparatus can employ a single energy strategy for the primary ion beam source coupled with an intra-layer modulating assist ion beam for bombarding the substrate surface during/after the material is deposited, wherein the energy of the assist ion beam is modulated or varied at the atomic monolayer, with the given layer.

The second preferred embodiment of the present invention relates to the use of an assisting flux of particles (atoms, ions or molecules) for assisting the atomic assembly of multilayers. More specifically it claims the use of low (0–50 eV) translational energy particle fluxes applied continuously or intermittently during/after the atomic deposition of thin films. The low energy inert gas ion/atom impacts with a deposition surface causing the growth surface to flatten without causing intermixing of dissimilar layers. When the assisting particles are of similar (or greater) atomic weight to that of the layers constituent atoms, the optimum particle energies for flattening without incurring mixing are in the 1–10 eV range or approximately thereto. Higher energies (about 1–50 eV) are optimal when the atomic weight of the assisting particle is reduced below that of the atoms composing the material deposited. For He, the optimum assisting energy lies in the 15–20 eV for normal incidence angle assistance, however, this energy is increased for highly oblique angles of incidence. The present invention also claims the use of a modulated assisting particle energy strategy where the energy/flux of the assisting particles is reduced (or absent) for the first 1–5 atomic monolayers of deposition of each new layer to avoid in atomic mixing with the layer below.

It should be noted that all assist particle energy ranges contemplated herein for the second alternative embodiment of the present invention are well below the minimum ion beam assist energies used in conventional teaching, and it is this non-obvious energy range that leads to such unexpected results (smooth, non-mixed interfaces). For example, U.S. Pat. No. 5,923,504 to Araki et al. teaches an ion assist beam within the range of 60 eV to 150 eV.

As one skilled in the art would appreciate, numerous approaches exist for forming particle fluxes with controllable low energies and appropriate fluxes. For example, they include, but not limited thereto, the use of molecular beams formed by seeded rarefied supersonic expansions, ionization of a background gas followed by electrostatic acceleration toward the substrate, and ion beam irradiation. All can be designed to provide assisting particle beams with the desired flux and energy to enable growth of multilayer structures with minimal interfacial roughness and intermixing.

A third preferred alternative embodiment of the present invention is to combine the modulation strategy together for both the primary ion beam source and the assist beam.

Practice of the present invention has been illustrated with the aforementioned Copper-Nickel multilayer structure, which have been presented herein for illustration purposes only and should not be construed as limiting the invention in any way.

An advantage of the present invention, but not limited thereto, is that it provides an apparatus and method for fabricating multilayer structures, using a physical-vapor deposition process, that has reduced interfacial roughness and interlayer mixing.

The invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims rather than by the foregoing description, and all changes which come within the meaning and range of equivalency of the claims are therefore intended to be embraced therein.

We claim:

1. A method of producing a multilayer structure by using a physical-vapor deposition apparatus comprising the steps of:

forming a bottom layer comprised of a first material comprising the steps of:

depositing a first plurality of monolayers of said first material on an underlayer using a low incident adatom energy;

depositing a second plurality of monolayers of said first material on top of said first plurality of monolayers of said first material using a high incident adatom energy;

forming a second layer comprised of a second material comprising the steps of:

depositing a first plurality of monolayers of said second material on said second plurality of monolayers of said first material using a low incident adatom energy; and depositing a second plurality of monolayers of said second material on said first plurality of monolayers of said second material using a high incident adatom energy.

2. The method of claim 1, wherein said bottom layer low incident adatom energy is about 0.1 eV and said bottom layer high incident adatom energy is about 5.0 eV.

3. The method of claim 1, wherein said second layer low incident adatom energy is about 0.5 eV and said second layer high incident adatom energy is about 3.0 eV.

4. The method of claim 1, wherein said bottom layer low incident adatom energy is about 0.1 eV to about 2.0 eV and said bottom layer high incident adatom energy is about 2.0 eV to about 15.0 eV.

5. The method of claim 1, wherein said second layer low incident adatom energy is about 0.1 eV to about 3.0 eV and said second layer high incident adatom energy is about 1.0 eV to about 10.0 eV.

6. A method of producing a multilayer structure by using a physical-vapor deposition apparatus comprising the steps of:
   a. forming a bottom layer comprised of a first material comprising the steps of:
      depositing a first plurality of monolayers of said first material on an underlayer using a low incident adatom energy;
      depositing a second plurality of monolayers of said first material on top of said first plurality of monolayers of said first material using a high incident adatom energy;
   b. forming a second layer comprised of a second material comprising the steps of:
      depositing a first plurality of monolayers of said second material on said second plurality of monolayers of said first material using a low incident adatom energy;
      depositing a second plurality of monolayers of said second material on said first plurality of monolayers of said -second material using a high incident adatom energy;
   c. forming a third layer comprised of said first material comprising the steps of:
      depositing a first plurality of monolayers of said first material on said second plurality of monolayers of said second material using a low incident adatom energy;
      depositing a second plurality of monolayers of said first material on said first plurality of monolayers of said first material of said third layer using a high incident adatom energy; and
   d. optionally repeating steps 'b' and 'c' a predetermined N number of times providing a plurality of second and third layers that are alternately stacked, wherein N is one or greater.

7. The method of claim 6, wherein said first material comprises substantially magnetic metal of at least one element selected from the group consisting of Co, Ni, Mn, Zr, Mo, Nb, Fe, rare earth material, and alloys thereof.

8. The method of claim 6, wherein said first material comprises substantially magnetic metal of at least one element selected from the group consisting of Co, Ni, Mn, Zr, Mo, Nb, Fe, rare earth material, and alloys thereof, and having added thereto at least one element selected from the group consisting of Pr, Pt, Tb, Gd, Dy, Sm, Nd, Eu, P, rare earth and alloys thereof.

9. The method of claim 6, wherein said second material comprises substantially non-magnetic metal of at least one element selected from the group consisting of Cu, Au, Cr, Ag, Pt, rare earth material, and alloys thereof.

10. The method of claim 6, wherein said second material comprises a non-magnetic metal of at least one element selected from the group consisting of Cu, Au, Cr, Ag, Pt, rare earth material, and alloys thereof, and having added thereto at least one element selected from the group consisting of alloys of said non-magnetic metal and of rare earth material.

11. The method of claim 6, wherein said bottom layer low incident adatom energy is about 0.1 eV and said bottom layer high incident adatom energy is about 5.0 eV.

12. The method of claim 6, wherein said second layer low incident adatom energy is about 0.5 eV and said second layer high incident adatom energy is about 3.0 eV.

13. The method of claim 6, wherein said third layer low incident adatom energy is about 0.1 eV and said third layer high incident adatom energy is about 5.0 eV.

14. The method of claim 6, wherein said bottom layer low incident adatom energy is about 0.1 eV to about 2.0 eV and said bottom layer high incident adatom energy is about 2.0 eV to about 15.0 eV.

15. The method of claim 6, wherein said second layer low incident adatom energy is about 0.1 eV to about 3.0 eV and said second layer high incident adatom energy is about 1.0 eV to about 10.0 eV.

16. The method of claim 6, wherein said third layer low incident adatom energy is about 0.1 eV to about 2.0 eV and said third layer high incident adatom energy is about 2.0 eV to about 15.0 eV.

17. The method of claim 6, wherein said multi layer structure is a GMR structure.

18. The method of claim 6, wherein said multilayer structure is a MRAM structure.

19. The method of claim 6, wherein said multilayer structure is a periodic laminated structure.

20. The method of claim 6, wherein said multilayer structure is a hetero-structure semiconductor device.

21. The method of claim 6, wherein said multilayer structure is an optical filter, optical mirror, or x-ray mirror device.

22. The method of any one of claims 1 or 6, wherein said physical-vapor deposition apparatus is an ion beam deposition (IBD) apparatus.

23. The method of any one of claims 1 or 6, wherein said physical-vapor deposition apparatus is a plasma sputtering deposition apparatus.

24. The method of any one of claims 1 or 6, wherein said physical-vapor deposition apparatus is a molecular beam epitaxy (MBE) apparatus.

25. A method of producing a multilayer structure by using a physical-vapor deposition apparatus comprising the steps of:
   a. forming a bottom layer comprised of a first material comprising the steps of:
      depositing a first plurality of monolayers of said first material on an underlayer using a predetermined incident adatom energy;
      depositing a second plurality of monolayers of said first material on top of said first plurality of monolayers of said first material using a predetermined incident adatom energy;
   b. forming a second layer comprised of a second material comprising the steps of:
      depositing a first plurality of monolayers of said second material on said second plurality of monolayers of said first material using a low incident adatom energy;

depositing a second plurality of monolayers of said second material on said first plurality of monolayers of said second material using a high incident adatom energy;

c. forming a third layer comprised of said first material comprising the steps of:
   depositing a first plurality of monolayers of said first material on said second plurality of monolayers of said second material using a low incident adatom energy;
   depositing a second plurality of monolayers of said first material on said first plurality of monolayers of said first material of said third layer using a high incident adatom energy; and d. optionally repeating steps 'b' and 'c' a predetermined N number of times providing a plurality of second and third layers that are alternately stacked, wherein N is one or greater.

26. A method of producing a multilayer structure by using a physical-vapor deposition apparatus comprising the steps of:

forming a bottom layer comprised of a first material comprising the steps of:
   depositing a first plurality of monolayers of said first material on an underlayer using a predetermined incident adatom energy;
   providing a particle assist beam incident the deposited first plurality of monolayers of said first material, said assist beam having an assist low energy of about 0.1 to about 15 eV for reducing intermixing of any proximate dissimilar layer materials thereto;
   depositing a second plurality of monolayers of said first material on top of said first plurality of monolayers of said first material using a predetermined incident adatom energy;
   providing a particle assist beam incident the deposited second plurality of monolayers of said first material, said assist beam having an assistance high energy of about 5.0 eV to about 50 eV for smoothing or flattening the deposition surface;

forming a second layer comprised of a second material comprising the steps of:
   depositing a first plurality of monolayers of said second material on said second plurality of monolayers of said first material using a predetermined incident adatom energy;
   providing a particle assist beam incident the deposited first plurality of monolayers of said second material, said assist beam having an assist low energy of about 0.1 to about 15 eV for reducing intermixing of any proximate dissimilar layer materials thereto;
   depositing a second plurality of monolayers of said second material on said first plurality of monolayers of said second material using a predetermined incident adatom energy; and
   providing a particle assist beam incident the deposited second plurality of monolayers of said second material, said assist beam having an assist high energy of about 5.0 eV to about 50 eV for smoothing or flattening the deposition surface.

27. The method of any one of claims 1, 6, 25, or 26 wherein said underlayer is a substrate, wafer, workpiece, or buffer planar.

28. An apparatus for physical-vapor deposition of a multilayer structure, onto an underlayer, the multilayer structure having a plurality of layers stacked on top of one another according to a predetermined sequence, the apparatus comprising:

a support means provided for supporting said underlayer;
a modulator means;
a deposit means for depositing a bottom layer of a first material of said multilayer structure, said first layer including:
   a first plurality of monolayers of said first material on an underlayer using a low incident adatom energy as determined by said modulator means;
   a second plurality of monolayers of said first material on top of said first plurality of monolayers of said first material using a high incident adatom energy as determined by said modulator means;
said deposit means for depositing a second layer of a second material of said multilayer structure, said second layer including:
   a first plurality of monolayers of said second material on said second plurality of monolayers of said first material using a low incident adatom energy as determined by said modulator means;
   a second plurality of monolayers of said second material on said first plurality of monolayers of said second material using a high incident adatom energy as determined by said modulator means; and
a controller operable with said modulator means and said deposit means.

29. An apparatus for physical-vapor deposition of a multilayer structure, onto an underlayer, the multilayer structure having a plurality of layers stacked on top of one another according to a predetermined sequence, the apparatus comprising:

a support means provided for supporting said underlayer;
a modulator means;
a deposit means for depositing a bottom layer of a first material of said multilayer structure, said first layer including:
   a first plurality of monolayers of said first material on an underlayer using a predetermined adatom energy as determined by said modulator means;
   a second plurality of monolayers of said first material on top of said first plurality of monolayers of said first material using a predetermined adatom energy as determined by said modulator means;
said deposit means for depositing a second layer of a second material of said multilayer structure, said second layer including:
   a first plurality of monolayers of said second material on said second plurality of monolayers of said first material using a low incident adatom energy as determined by said modulator means;
   a second plurality of monolayers of said second material on said first plurality of monolayers of said second material using a high incident adatom energy as determined by said modulator means;
said deposit means for depositing a third layer of said first material of said multilayer structure, said third layer including:
   a first plurality of monolayers of said first material on said second plurality of monolayers of said second material using a low incident adatom energy as determined by said modulator means;
   a second plurality of monolayers of said first material on said first plurality of monolayers of said first material of said third layer using a high incident adatom energy as determined by said modulator means; and
a controller operable with said modulator means and said deposit means, whereby said controller provides a predetermined N number of times that said second and third layers are repeatedly deposited so as to provide second and third layers that are alternately stacked, wherein N is zero or greater.

30. An apparatus for physical-vapor deposition of a multilayer structure, onto an underlayer, the multilayer structure having a plurality of layers stacked on top of one another according to a predetermined sequence, the apparatus comprising:

a support means provided for supporting said underlayer;

a modulator means;

a deposit means for depositing a bottom layer of a first material of said multilayer structure, said first layer including:
  a first plurality of monolayers of said first material on an underlayer using a predetermined incident adatom energy as determined by said modulator means;
  a second plurality of monolayers of said first material on top of said first plurality of monolayers of said first material using a predetermined incident adatom energy as determined by said modulator means;

said deposit means for depositing a second layer of a second material of said multilayer structure, said second layer including:
  a first plurality of monolayers of said second material on said second plurality of monolayers of said first material using a low incident adatom energy as determined by said modulator means;
  a second plurality of monolayers of said second material on said first plurality of monolayers of said second material using a high incident adatom energy as determined by said modulator means;

said deposit means for depositing a third layer of said first material of said multilayer structure, said third layer including:
  a first plurality of monolayers of said first material on said second plurality of monolayers of said second material using a low incident adatom energy as determined by said modulator means;
  a second plurality of monolayers of said first material on said first plurality of monolayers of said first material of said third layer using a high incident adatom energy as determined by said modulator means; and a controller operable with said modulator means and said deposit means, whereby said controller provides a predetermined N number of times that said second and third layers are repeatedly deposited so as to provide second and third layers that are alternately stacked, wherein N is zero or greater.

31. An apparatus for physical-vapor deposition of a multilayer structure, onto an underlayer, the multilayer structure having a plurality of layers stacked on top of one another according to a predetermined sequence, the apparatus comprising:

a support means provided for supporting said underlayer;

a modulator means;

a deposit means for depositing a bottom layer of a first material of said multilayer structure, said first layer including:
  a first plurality of monolayers of said first material on an underlayer using a predetermined incident adatom energy as determined by said modulator means;
  a second plurality of monolayers of said first material on top of said first plurality of monolayers of said first material using a predetermined incident adatom energy as determined by said modulator means;

an assist beam means for bombarding said deposited first plurality of monolayers of said first material, wherein:
  said bombardment providing a particle assist beam incident the deposited first plurality of monolayers of said first material, said assist beam having an assist low energy of about 0.1 to about 15 eV for reducing intermixing of any proximate dissimilar layer materials thereto;

said assist beam means for bombarding said deposited second plurality of monolayers of said first material, wherein:
  providing a particle assist beam incident the deposited second plurality of monolayers of said first material, said assist beam having an assistance adatom high energy of about 5.0 eV to about 50 eV for smoothing or flattening the deposition surface;

said deposit means for depositing a second layer of a second material of said multilayer structure, said second layer including:
  a first plurality of monolayers of said second material on said second plurality of monolayers of said first material using a predetermined incident adatom energy as determined by said modulator means;
  a second plurality of monolayers of said second material on said first plurality of monolayers of said second material using a predetermined incident adatom energy as determined by said modulator means.

said assist beam means for bombarding said deposited first plurality of monolayers of said second material, wherein:
  said bombardment provides providing a particle assist beam incident the deposited first plurality of monolayers of said first material, said assist beam having an assist low energy of about 0.1 to about 15 eV for reducing intermixing of any proximate dissimilar layer materials thereto;

said assist beam means for bombarding said deposited second plurality of monolayers of said second material, wherein:
  providing a particle assist beam incident the deposited second plurality of monolayers of said second material, said assist beam having an assist high energy of about 5.0 eV to about 50 eV for smoothing or flattening the deposition surface.

32. The apparatus as in any one of claims 28, 29, 30, or 31 wherein said physical-vapor deposition comprises an ion beam deposition (IBD) process.

33. The apparatus as in any one of claims 28, 29, 30, or 31 wherein said physical-vapor deposition comprises a plasma sputtering deposition process.

34. The apparatus as in any one of claims 28, 29, 30, or 31 wherein said physical-vapor deposition comprises a molecular beam epitaxy (MBE) process.

* * * * *